United States Patent
Lynch et al.

(10) Patent No.: US 7,391,372 B2
(45) Date of Patent: Jun. 24, 2008

(54) INTEGRATED PHASED ARRAY ANTENNA

(75) Inventors: Jonathan J. Lynch, Oxnard, CA (US); Peter D. Brewer, Westlake Village, CA (US); Andrew T. Hunter, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 188 days.

(21) Appl. No.: 10/862,043

(22) Filed: Jun. 3, 2004

(65) Prior Publication Data
US 2004/0263393 A1    Dec. 30, 2004

Related U.S. Application Data

(60) Provisional application No. 60/483,318, filed on Jun. 26, 2003.

(51) Int. Cl.
H01Q 1/38 (2006.01)
(52) U.S. Cl. ............................... 343/700 MS
(58) Field of Classification Search ......... 343/700 MS, 343/850, 852, 776–778, 771
See application file for complete search history.

(56) References Cited

U.S. PATENT DOCUMENTS

| | | | | |
|---|---|---|---|---|
| 5,087,922 A * | 2/1992 | Tang et al. | ................. | 343/853 |
| 5,903,239 A * | 5/1999 | Takahashi et al. | ..... | 343/700 MS |
| 6,037,911 A * | 3/2000 | Brankovic et al. | .... | 343/700 MS |
| 6,198,450 B1 | 3/2001 | Adachi et al. | ................ | 343/753 |
| 6,249,242 B1 * | 6/2001 | Sekine et al. | ......... | 343/700 MS |
| 6,307,510 B1 * | 10/2001 | Taylor et al. | .......... | 343/700 MS |
| 6,313,797 B1 | 11/2001 | Kurita et al. | .......... | 343/700 MS |
| 6,323,808 B1 | 11/2001 | Heinrichs et al. | ..... | 343/700 MS |
| 6,323,824 B1 | 11/2001 | Heinrichs et al. | ........... | 343/846 |
| 6,384,785 B1 * | 5/2002 | Kamogawa et al. | ... | 343/700 MS |
| 6,407,718 B2 | 6/2002 | Adachi et al. | ............... | 343/878 |
| 2001/0015683 A1 | 8/2001 | Mikami et al. | .............. | 333/134 |
| 2004/0263422 A1 | 12/2004 | Lynch | ................. | 343/700 MS |

FOREIGN PATENT DOCUMENTS

JP            2000-059140          *  2/2000

OTHER PUBLICATIONS

Dorris, R., et al., "Mutual Coupling Between Probe-Fed Dielectric Resonator Antennas," INTERNET: <http://www.egr.uh.edu/uhecereu/Rdabstract.html 1 page total (2001).

"Design of Low-Profile DR Antennas," INTERNET: <http://www.elec.mq.edu.au/research/electromag/antenna1/antl_abs.html> pp. 1-2 (Feb. 26, 2002).

(Continued)

*Primary Examiner*—Trinh Dinh
*Assistant Examiner*—Ephrem Alemu
(74) *Attorney, Agent, or Firm*—Ladas & Parry

(57) ABSTRACT

An integrated communication device having a substrate layer of substantially electrically nonconductive material with two substantially parallel surfaces, an antenna element disposed on one of the surfaces, a ground layer of substantially electrically conductive material disposed on the other surface and having an opening formed therethrough opposite from the antenna element, and a transceiver device mounted to the ground layer to transmit and/or receive electromagnetic energy through the opening.

9 Claims, 3 Drawing Sheets

OTHER PUBLICATIONS

Esselle, K.P., "A Low-Profile Rectangular Dielectric-Resonator Antenna," *IEEE Transactions on Antennas and Propagation*, vol. 44, No. 9, pp. 1296-1297 (Sep. 1996).

McAllister, M.W., et al., "Rectangular Dielectric Resonator Antenna," *Electronics Letters*, vol. 19, No. 6, pp. 218-219 (Mar. 17, 1983).

Petosa, A., et al., "Design and Analysis of Multisegment Dielectric Resonator Antennas," *IEEE Transactions on Antennas and Propagation*, vol. 48, No. 5, pp. 738-742 (May 2000).

Robertson, I.D., "Millimeter-Wave Back-Face Patch Antenna for Multilayer MMICs," *Electronics Letters*, vol. 29, No. 9, pp. 816-818 (Apr. 29, 1993).

* cited by examiner

INTEGRATED PHASED ARRAY ANTENNA

CLAIM OF BENEFIT OF PROVISIONAL APPLICATION

This application claims the benefit of U.S. Provisional application Ser. No. 60/483,318 filed on Jun. 26, 2003, which is incorporated herein by reference in its entirety.

TECHNICAL FIELD

The present invention relates to phased array antennas. More specifically, the present invention relates to an integrated phased array antenna with improved thermal properties and coupling efficiency.

BACKGROUND

Antenna systems are widely used in both ground based applications (e.g., cellular antennas) and airborne applications (e.g., airplane or satellite antennas). For example, so-called "smart" antenna systems, such as adaptive or phased array antennas, combine the outputs of multiple antenna elements with signal processing capabilities to transmit and/or receive communications signals (e.g., microwave signals, RF signals, etc.). As a result, such antenna systems can vary the transmission or reception pattern (i.e., "beam shaping" or "spoiling") or direction (i.e., "beam steering") of the communications signals in response to the signal environment to improve performance characteristics.

A typical phased array antenna may include, for example, one or more element controllers connected to a central controller. Among other functions, the element controllers process beam control commands generated by the central controller (e.g., beam steering signals and/or beam spoiling signals) and provide output control signals for each of the phased array antenna elements. More particularly, each antenna element may have a phase shifter, attenuator, delay generator, etc., and the output control signals from the element controller may be used to control a phase, attenuation, or delay thereof. Thus, the transmission or reception pattern may be varied, as noted above. In such phased array antennas, temperature changes may have a significant impact on phase shifters, attenuators, or operating frequencies of the phased array antenna that may result in undesirable signal characteristics. This problem is compounded by the fact that the power amplifiers driving these phased array antennas generate a relatively considerable amount of heat. Therefore, maintaining the operating temperature within a desirable range is critical to the performance of a phased array antenna system.

Phased array antennas are typically designed using either a "brick" architecture or a "tile" architecture. In a brick architecture, the active and passive communication components are mounted on rectangular Transmit Receive Modules (TRMs) that resemble bricks, and are placed behind the radiating elements perpendicular to the array face. In a tile architecture, the components are placed on small modules that mount parallel to the array face, much like common tiles. FIG. 1 depicts a schematic side view of a portion of a phased array system utilizing a tile architecture, including a transceiver device in the form of an integrated circuit (IC) chip 10 (such as a Monolithic Microwave IC or MMIC) mounted on an insulating substrate 20. The insulating substrate is separated from an antenna substrate 30 by a ground plane 40. Mounted upon the antenna substrate 30 is an antenna element 50 for transmitting and receiving radio signals. The ground plane 40 is formed of an electrically conductive material and includes an opening 42 overlying the antenna element 50. The insulating substrate 20 is typically formed of ceramic material, which is an excellent electrical insulator and also a poor heat conductor. Therefore, a cooling manifold 60 is usually located behind the chip 10, on the side opposite the antenna elements 50. This approach to cooling phased array antenna systems has been moderately successful, but entails the additional costs and complexity associated with the cooling manifold fabrication and attachment.

Components on tiles are typically mounting using standard "pick and place" and wirebonding techniques, which are costly and time consuming procedures that prohibit cost effective manufacturing of very large arrays. Coupling between the input/output antennas and the MMIC circuit is typically accomplished by transitioning off the communication chip using a standard technique (e.g. wire bonding), then transitioning to the antenna using other types of transitions. This technique has been known to adversely impact the efficiency of energy transfer between the communication chips and the antennas due to inaccurately placed or lossy wirebonds.

To avoid problems associated with the creation of plated-through holes (or vias), aperture coupling is a commonly used method for exciting patch antennas and has a number of advantages over other methods such as probe coupling or in-plane excitation from components mounted next to the antennas. Probe coupling through a ground plane aperture requires additional processing steps to provide conductive feed-through holes (vias) in the antenna substrate, which restricts the types of materials used for the antenna substrate (e.g., Sapphire is difficult to drill or etch through). On the other hand, mounting the MMIC components on the antenna substrate next to the antenna elements may eliminate the need for plated through holes, but this approach places the MMIC components directly within the radiated fields of the antenna array, potentially causing spurious coupling between different sections of the transmit or receive circuitry, and possibly causing spurious scattering of the radiated fields due to the additional circuitry present on the antenna layer. Additionally, this also reduces the surface area available for chip placement, which is already severely limited by the large areas typically occupied by the antenna elements. Aperture coupled patch antennas eliminate these issues by shielding the MMIC components safely behind a ground plane, and utilizing ground plane apertures to efficiently couple the signals to and from the antenna elements, without the need for plated through holes. As further shown in FIG. 1, aperture coupling entails transitioning off the chip 10 using a wire bond 70 to a conductive microstrip 80 which couples electromagnetically with the antenna element 50 through the opening 42 in the ground plane 40.

The present invention further improves upon the design of phased array antennas and enhances their operating efficiency by more efficient coupling and improved cooling performance.

SUMMARY

In a first embodiment as disclosed herein, a communication device comprises a substrate layer of substantially electrically nonconductive material having two substantially parallel surfaces, an antenna element disposed on one of the surfaces, a ground layer of substantially electrically conductive material disposed on the other surface and having an opening formed therethrough opposite from the antenna element, and a transceiver device mounted to the ground layer to transmit and/or receive electromagnetic energy through the opening.

In another embodiment disclosed herein, a phased array antenna device comprises a substrate layer of substantially electrically nonconductive material having two substantially parallel surfaces, a plurality of antenna elements disposed on one of the surfaces, a ground layer of substantially electrically conductive material disposed on the other surface and having an opening formed therethrough opposite from each antenna element, and a plurality of transceiver devices mounted to the ground layer to transmit and/or receive electromagnetic energy through the openings.

In a further embodiment disclosed herein, a communication device comprises a substrate layer of substantially electrically nonconductive material having two substantially parallel surfaces, an antenna element disposed on one of the surfaces, and a transceiver device disposed on the other surface to exchange electromagnetic energy with the antenna element.

In other embodiments, the transceiver device may be a monolithic microwave integrated circuit (MMIC). Additionally, the substrate layer may be formed of Aluminum Nitride or Sapphire. The antenna elements may be patch antennas.

These and other features and advantages will become further apparent from the detailed description and accompanying figures that follow. In the figures and description, numerals indicate various features, like numerals referring to like features throughout both the drawings and the description.

DETAILED DESCRIPTION

Figure 1:
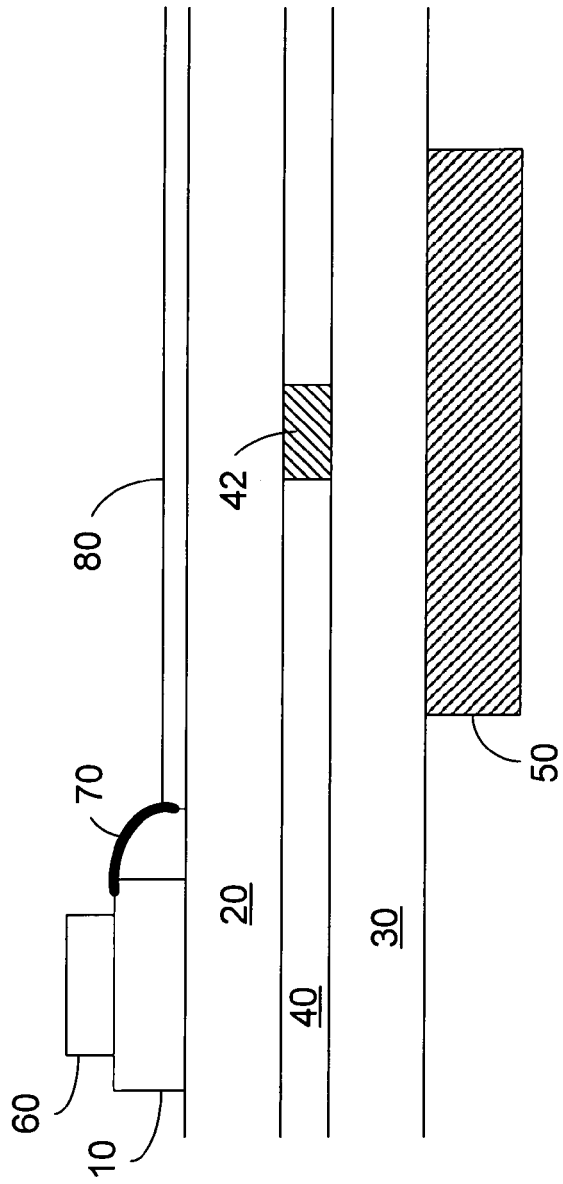
FIG. 1 is a schematic partial side view of a phased array antenna as known in the art.
Figure 2:
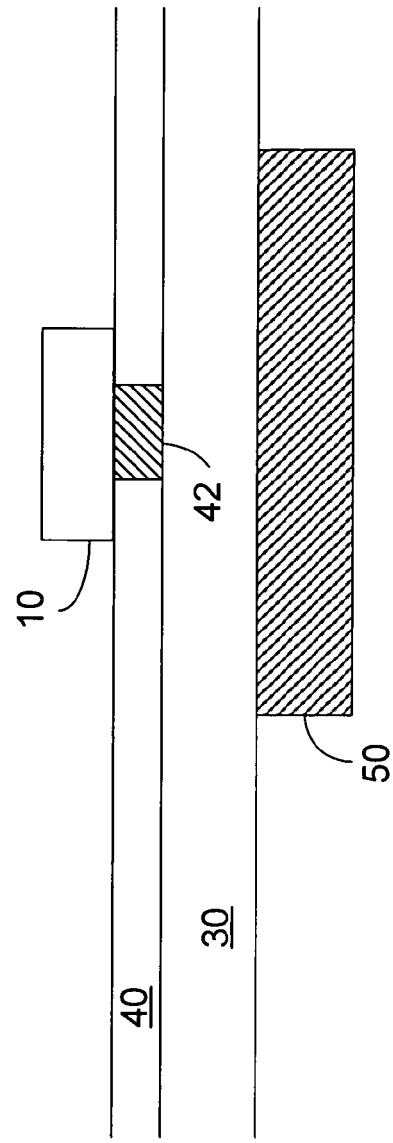
FIG. 2 is a schematic partial side view of a communication system as disclosed herein.

With reference to FIG. 2, in one embodiment a communication device such as a MMIC transceiver 10 is mounted directly to a surface of a ground plane 40 and overlying an opening 42 formed therein. The ground plane is formed of an electrically conductive material, is typically very thin, and is bonded on its other surface to an antenna substrate 30 that is formed of an electrically insulating material. Mounted upon the antenna substrate is an antenna element 50 for transmitting and receiving radio signals. The antenna substrate may be formed of a material such as sapphire or aluminum nitride.

In operation, the transceiver device 10 is electromagnetically coupled to the antenna element 50 through the opening 42 in the ground plane 40. In this manner, the transceiver and the antenna element can exchange electromagnetic energy, such as when the antenna element receives radio signals that it radiates to the transceiver through the opening 42, or when the transceiver transmits electromagnetic signals through the opening to be picked up by the antenna element and transmitted as radio signals. During operation, the transceiver device emits heat generated by its internal components. Because the antenna substrate 30 is composed of a material such as sapphire or aluminum nitride, which have good heat transfer properties, the heat generated by the transceiver device is transmitted through the thin, metallic ground plane 40 and into the substrate, from where it is quickly and efficiently dissipated into the environment.

Figure 3:
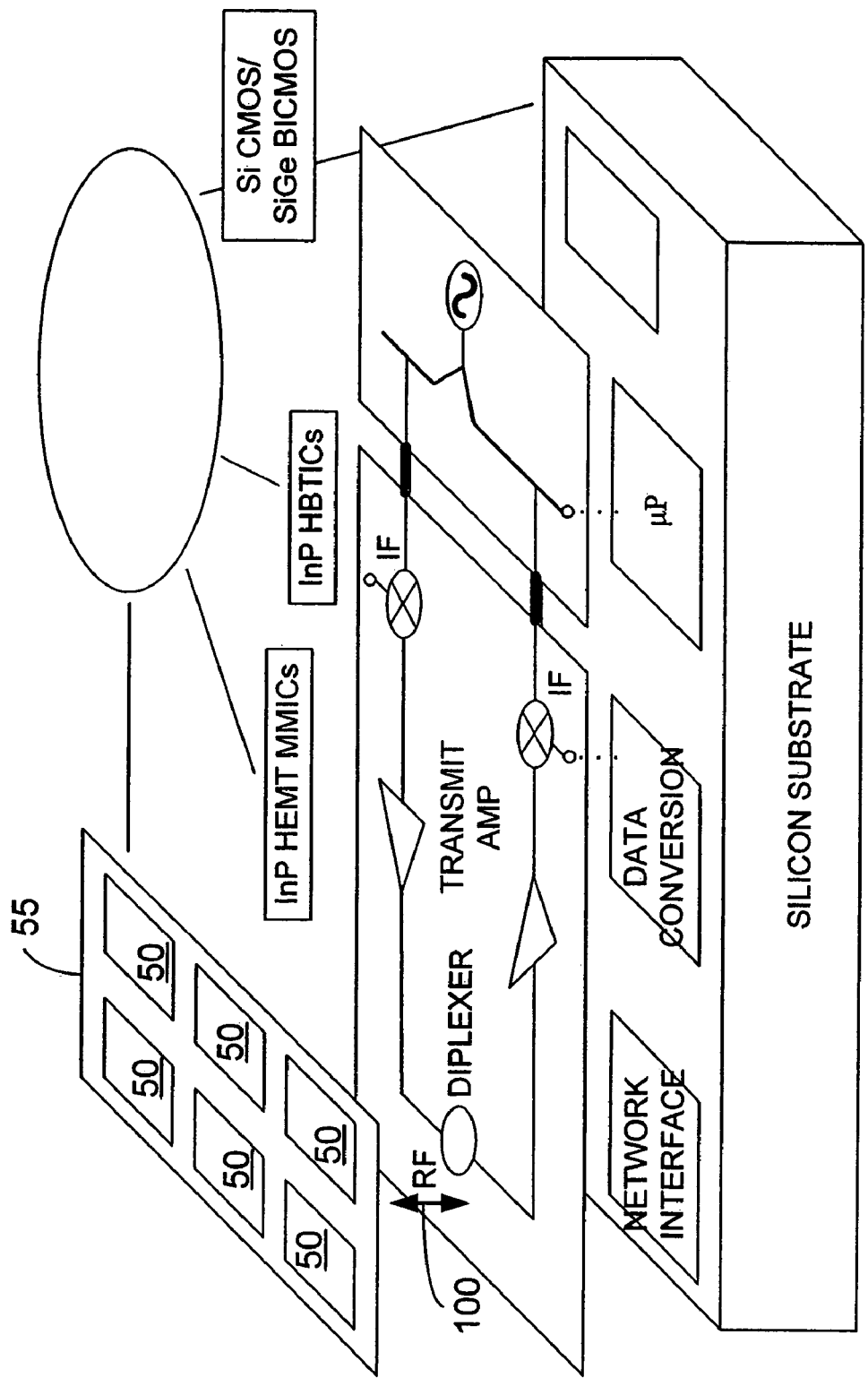
FIG. 3 is a diagram of a phased array antenna device including an embodiment disclosed herein.

In accordance with the embodiments described above, an improved communication device such as a phased array antenna may be manufactured to exhibit improved efficiency and cooling. For instance, as shown in FIG. 3, the embodiments disclosed herein may be used to create advanced phased array systems. The antenna array forms the foundation upon which the front-end RF components and signal processing electronics are registered and assembled. An aperture coupled antenna fed in accordance with the principles disclosed herein enables the input and output antenna elements 50 to be fully integrated with the front-end MMIC components in a way that achieves high RF efficiency and excellent thermal management of the MMIC components while retaining the advantages of the large scale self-assembly. This approach achieves these goals by electromagnetically coupling the MMIC component directly to a patch antenna radiator 55 through an aperture in the MMIC ground as illustrated by the double arrow 100 in FIG. 3.

In an embodiment, a template transfer method may be used to enable mass integration of precisely registered arrays of high performance front-end RF components with such an antenna array. In this approach, high performance components including InP MMICs based on high electron-mobility transistors (HEMTs, suitable for Low Noise Amplifiers) and heterojunction bipolar transistors (HBTs, suitable for high power amplifiers and sources) may be directly bonded to the antenna assembly and thereby enable proper thermal management. Planarization layers may be applied to the MMIC components comprising RF compatible materials and patterned metal transmission lines and transitions may be fabricated to provide interconnection within and between components. Baseband signals can be converted to and from microwave frequencies by Schottky diode mixers that receive a pump signal being coherently distributed to the array from neighboring InP HBT-based oscillators. CMOS circuits shielded from the RF circuitry may be used to provide control, data conversion, and digital signal processing. Silicon CMOS is a technology well suited to processing the complex baseband waveforms used by spectrally efficient communications systems and radars, as well as data storage, analysis, and network and programming interfaces.

The novel embodiments described herein may also be utilized to achieve integration of multiple device technologies. To accomplish this, the input and output antennas must also be fully integrated with the MMIC components in a way that achieves high RF efficiency while retaining the advantages of large scale fluidic self assembly. The embodiments disclosed herein achieve these goals by electromagnetically coupling the MMIC component 10 directly to a patch antenna radiator 50 through an aperture 42 in the MMIC ground plane 40, as previously described and also as further shown in FIG. 4. Aperture coupling between the antennas 50 and MMICs 10 allows for the utilization of antenna substrate materials that offer certain advantages, but would produce fabrication difficulties for probe fed antennas. Sapphire or Aluminum Nitride (AlN) provide a good thermal path for heat generated within the MMIC components, while ensuring low millimeter wave (mmW) losses. The MMIC components may be bonded directly to the antenna substrate to transfer mmW energy between the antenna and the MMIC through an aperture in both the antenna ground plane and MMIC backside ground. A microstrip line located on the MMIC chip may excite the aperture and connect directly to active MMIC circuitry.

Aperture coupling of antennas provides a simple and efficient method of excitation, but extraneous radiation may occur within the buried circuit layers. The MMIC components are located between two ground planes, one functioning as the RF ground plane 40 for the antenna and RF/mmW elements, and the other for the Silicon signal processing. Because apertures are bi-directional radiators, it is possible for a significant amount of power to be radiated into the areas between the ground planes, thus reducing overall efficiency and possibly introducing unwanted spurious coupling effects. To eliminate this spurious coupling, the two ground planes may be shorted together using an array of plated-through holes located less than one half of a wavelength in the material (~400 microns). It is important to note that the plated-through holes are not required in the antenna substrate 30, which also serves as the heat conduction path. The materials chosen for the MMIC spacer layer must accommodate plated-through holes. An example of a suitable material is high resistivity silicon.

Typical circuitry on a W band MMIC chip consists of Coplanar Waveguides (CPW) connecting InP HEMT devices, with integrated vias 110 that connect the top and bottom side grounds on opposite sides of the chip. The proximity of the additional signal processing circuit ground to the RF circuitry can adversely impact RF performance if that ground is located too close to the MMIC components. The appropriate spacing depends on the type of material used for the MMIC spacer layer, and can be determined by EM simulation. In one embodiment it is anticipated that the spacer layer will be thicker than the expected thickness of the MMIC component (~50 microns).

Figure 4:
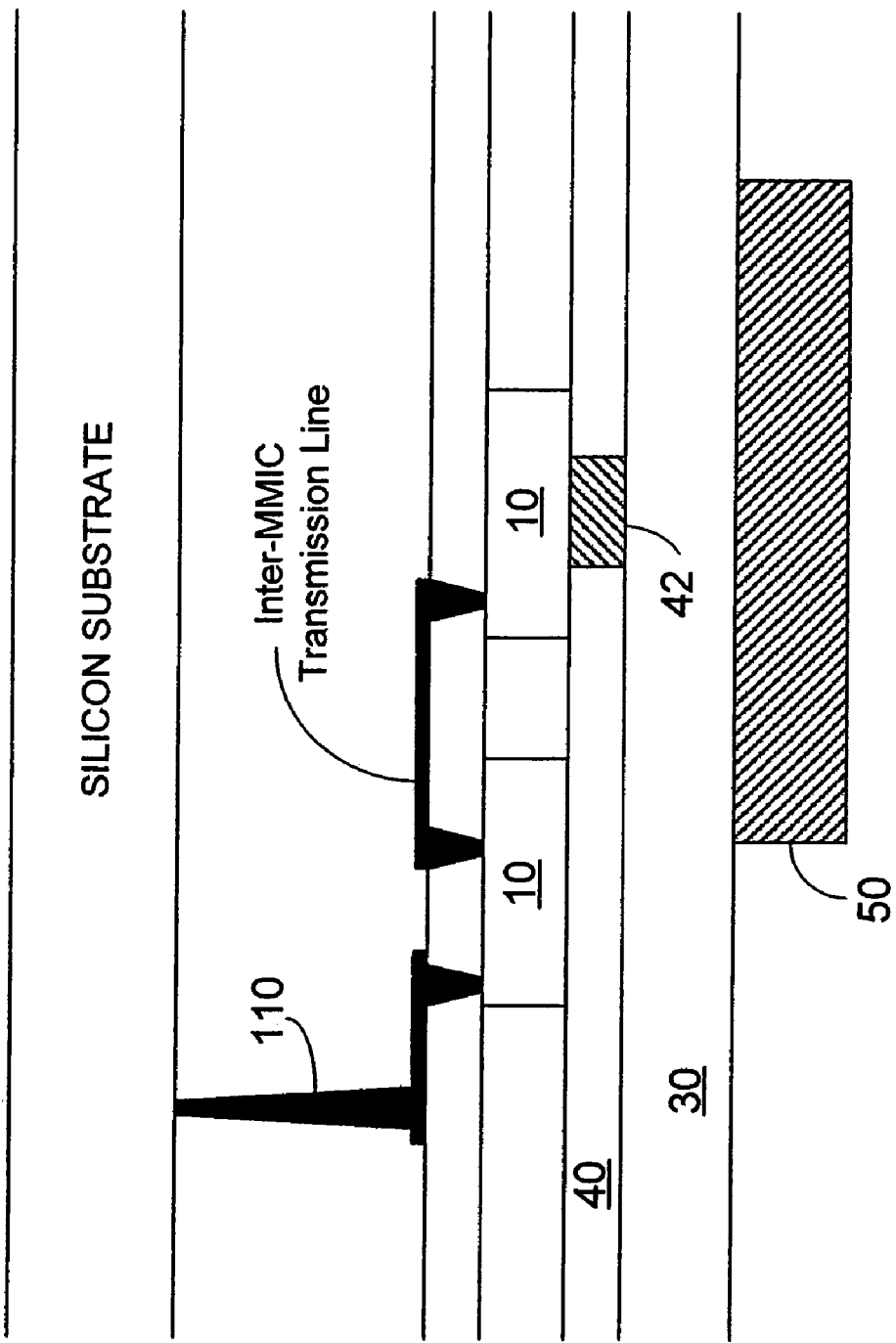
FIG. 4 is a schematic view of another phased array antenna device including an embodiment disclosed herein.

In another embodiment, RF interconnects may be fabricated in accordance with the principles disclosed herein. High-performance interconnections are essential for horizontal transport of DC and RF signals among MMIC front-end components and for vertical connection to Si signal processing electronics. The novel embodiments disclosed herein precisely orient components with respect to one another and the antenna array. This enables, through the use of standard RF circuit processing techniques, the creation of a wide variety of transmission lines maintaining excellent performance. Such structures include conductors with one or two ground planes (microstrip and stripline, respectively), coplanar strips (CPS) and three-conductor coplanar waveguides (CPW) as shown in FIG. 4. These transmission lines are used extensively in MMICs and conventional RF printed circuits. Using low-loss dielectrics and mode suppression techniques developed for millimeter-wave MMICs and subsystems, operation at frequencies up to ~100 GHz may be practical. The capacity for fabricating RF interconnects between dissimilar ICs with controlled impedance, coupling, and radiation characteristics is one of the unique potential benefits of the embodiments disclosed herein.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

What is claimed is:

1. A phased array antenna device, comprising:
    a substrate layer of substantially electrically nonconductive material having two substantially parallel surfaces;
    a plurality of antenna elements disposed on one of the surfaces;
    a ground layer of substantially electrically conductive material disposed on the other surface and having an opening formed therethrough opposite from each antenna element; and
    a plurality of transceiver devices mounted to the ground layer to transmit and/or receive electromagnetic energy through the openings.

2. The device of claim 1, wherein each transceiver device is mounted to transmit and/or receive electromagnetic energy through a respective one of the openings.

3. The device of claim 2, wherein each transceiver device comprises a monolithic microwave integrated circuit.

4. The device of claim 2, wherein the substrate layer is formed of material selected from the group of materials comprising Aluminum Nitride and Sapphire.

5. The device of claim 2, wherein each antenna element is a patch antenna.

6. A method, comprising:
    forming a plurality of openings through a ground layer of substantially electrically conductive material;
    disposing the ground layer onto a first surface of a substrate layer of substantially electrically nonconductive material;
    disposing a plurality of antenna elements onto a second surface of the substrate layer substantially opposite from the first surface, one antenna element over each opening of the ground layer and
    mounting a plurality of transceiver devices to the ground layer, each transceiver device mounted overlying a respective one of the plurality of openings to transmit and/or receive electromagnetic energy through the respective opening.

7. The method of claim 6, wherein at least one of the transceiver devices comprises a monolithic microwave integrated circuit.

8. The method of claim 6, wherein the substrate layer is formed of material selected from the group of materials comprising Aluminum Nitride and Sapphire.

9. The method of claim 6, wherein at least one antenna element is a patch antenna.

* * * * *